(12) United States Patent
Tikka

(10) Patent No.: US 6,985,052 B2
(45) Date of Patent: Jan. 10, 2006

(54) COMPONENT OPERATING WITH BULK ACOUSTIC WAVES, AND HAVING COUPLED RESONATORS

(75) Inventor: Pasi Tikka, Taufkirchen (DE)

(73) Assignee: EPCOS AG, Munich (DE)

( * ) Notice: Subject to any disclaimer, the term of this patent is extended or adjusted under 35 U.S.C. 154(b) by 53 days.

(21) Appl. No.: 10/734,067

(22) Filed: Dec. 11, 2003

(65) Prior Publication Data

US 2004/0124952 A1 Jul. 1, 2004

(30) Foreign Application Priority Data

Dec. 13, 2002 (DE) ................................ 102 58 422

(51) Int. Cl.
*H03H 9/54* (2006.01)
*H03H 9/56* (2006.01)
(52) U.S. Cl. ..................... 333/189; 333/192; 310/322
(58) Field of Classification Search ........ 333/186–192; 310/322, 335
See application file for complete search history.

(56) References Cited

U.S. PATENT DOCUMENTS

| | | | |
|---|---|---|---|
| 6,307,447 B1 * | 10/2001 | Barber et al. | 333/189 |
| 6,441,703 B1 * | 8/2002 | Panasik | 333/189 |
| 6,509,814 B2 * | 1/2003 | Milsom | 333/189 |
| 2002/0084873 A1 | 7/2002 | Ella et al. | 333/189 |

* cited by examiner

*Primary Examiner*—Barbara Summons
(74) *Attorney, Agent, or Firm*—Schiff Hardin LLP

(57) ABSTRACT

The invention relates to a component operating with bulk acoustic waves, which comprises a mount substrate, thin-film resonators and an acoustic mirror, with coupled resonators being arranged jointly on this mirror. At least one mirror layer—a coupling layer—is in the form of an electrically conductive layer. This mirror layer forms coupling capacitances with lower electrodes of the resonators, thus resulting in deliberate capacitive coupling between the resonators which, according to the invention, is used in order to achieve additional pole points in the blocking areas of the filter transfer function. The capacitive coupling of the resonators may, for example, be influenced by partial structuring of the coupling layer in order, in particular, to shift the frequency of the pole points.

11 Claims, 9 Drawing Sheets

COMPONENT OPERATING WITH BULK ACOUSTIC WAVES, AND HAVING COUPLED RESONATORS

BACKGROUND OF THE INVENTION

The invention relates to a component operating with bulk acoustic waves that comprises a thin-film resonator, which is also called a (Thin Film Bulk Acoustic Wave Resonator (FBAR) or Bulk Acoustic Wave (BAW) resonator.

Components such as these can be used in particular as filters in terminals for mobile telecommunications.

FIG. 1 schematically illustrates a cross section of a known BAW component with two thin-film resonators PR1 and PR2 that are arranged, for example, in parallel branches of a filter circuit. The thin-film resonators each contain an upper electrode E21 and E22, and share a lower electrode, E1. A piezoelectric layer PS is arranged in between. The resonators PR1, PR2 are arranged on a carrier substrate TS. An acoustic mirror, that is in each case arranged between each resonator and the carrier substrate, comprises an alternating sequence of layers of high and low acoustic impedance, and prevents the acoustic wave from emerging from the resonator in the direction of the carrier substrate TS. The thickness of each of the mirror layers is in each case approximately ¼ of the wavelength of the acoustic wave in the given material. A first acoustic mirror, which is arranged under the resonator PR1, comprises an alternating sequence of layers with low acoustic impedance (LZ1, LZ2, LZ3) and structured layers with a high acoustic impedance, which have structures HZ11 and HZ21. A second acoustic mirror, which is arranged under the resonator PR2, is formed by an alternating sequence of layers with low acoustic impedance (LZ1, LZ2, LZ3) and structures HZ12, HZ22 of the structured layers with high acoustic impedance.

The mirror layers with a high acoustic impedance may be conductive layers. In the present invention, high acoustic impedance layers are typically conductive. As a rule, layers such as these have to be structured in order to reduce disturbing capacitive couplings via a continuous conductive layer when there are two or more resonators that are arranged on a common acoustic mirror.

An arrangement of two resonators which are electrically connected to one another via their upper electrodes on a common acoustic mirror with continuous conductive layers is known, for example, from U.S. Published Application No. 2002/0084873 A1. The continuous conductive mirror layer in this case couples the lower electrodes of the resonators, while these resonators are electrically connected to one another via their upper electrodes. The coupling thus bridges the resonators in the corresponding signal path.

Components that are used in mobile radio terminals must, on the one hand, have a low insertion loss for the signal in the passband, and on the other hand must have high selectivity in predetermined stopbands.

SUMMARY OF THE INVENTION

The object of the present invention is to make use of the coupling of selected resonators in a filter in order to achieve high selectivity in the filter transfer function.

This object is achieved according to the invention by a component operating with bulk acoustic waves, comprising an acoustic mirror comprising an electrically conductive mirror layer that acts as a coupling layer; a signal path along which an electrical signal is guided; and a number N of resonators that are electrically connected to one another and each having a lower and an upper electrode, with n resonators, where $2 \leq n \leq N-1$, being arranged jointly and alongside one another on the acoustic mirror, the n resonators being coupled to one another via coupling capacitances that are formed: a) by lower electrodes of the n resonators, and b) by at least one of the coupling layer and further capacitively coupled electrically conductive mirror layers, with the n resonators being arranged and electrically connected to one another such that the coupling capacitance does not bridge any of the resonators in the signal path.

The invention provides a component operating with bulk acoustic waves with an electrical signal being guided along a signal path, the component having an acoustic mirror and having a total of N thin-film resonators that are electrically connected to one another. The resonators each have a lower and an upper electrode.

The acoustic mirror may comprise an alternating sequence of mirror layers with a relatively high and a relatively low acoustic impedance. In this case, at least one mirror layer (typically a high-impedance layer) is in the form of an electrically conductive mirror layer which acts as a coupling layer. A total of n resonators, where $2 \leq n \leq N-1$, may be arranged jointly and alongside one another on the acoustic mirror, with the n resonators being coupled to one another via coupling capacitances which are formed on the one hand by lower electrodes of the n resonators and on the other hand by the coupling layer and/or via further capacitively coupled electrically conductive mirror layers. The n resonators are arranged and electrically connected to one another such that the coupling capacitance does not bridge any of the resonators in the signal path.

The upper electrodes of the n resonators are preferably not electrically connected to one another. The lower electrodes of the n resonators may (in addition to the capacitive coupling via the conductive mirror layer) be electrically connected to one another. An electrical connection by way of a line section which represents a short circuit for direct current has a finite impedance in the radio-frequency band. The connection of the coupling capacitance in parallel with this line section reduces the impedance value of the electrical connection.

It is also possible for there to be no electrical connection between the lower electrodes of the n resonators.

The resonators may be in the form of series resonators and/or parallel resonators which are arranged in series branches and parallel branches, respectively, of a filter circuit. In one advantageous embodiment, all the resonators which are arranged jointly on the acoustic mirror and are capacitively coupled to one another are in the form of parallel resonators. In a further variant of the invention, all the resonators which are arranged jointly on the acoustic mirror and are capacitively coupled to one another are series resonators.

The resonators (for example, series resonators) which are not arranged on the acoustic mirror mentioned initially are preferably each arranged on further, separate acoustic mirrors, with at least some of them being capacitively decoupled from one another, or are arranged jointly on a further acoustic mirror. The further acoustic mirror may be at least partially structured in order to reduce the undesirable parasitic capacitances between specific resonators. In this case, the resonators (which are arranged alongside one another) are arranged above non-continuous structures of the structured mirror layer, and at least some of them are capacitively decoupled from one another.

At least some of the resonators (preferably series resonators) which are not arranged on the acoustic mirror mentioned initially may be capacitively coupled to one another, with the coupling capacitance being connected in parallel with the line section which connects in each case two resonators, and with them being arranged jointly on a further acoustic mirror with at least one continuous conductive layer.

The acoustic mirrors are preferably arranged on a carrier substrate. It is possible for the upper boundary surface of a mirror layer to be planar.

In one advantageous embodiment of the invention, it is possible to structure two or more electrically conductive mirror layers.

In a further advantageous embodiment of the invention, the component comprises a resonator system in the form a stacked crystal filter, with at least two thin-film resonators that are stacked one on top of the other and are acoustically coupled to one another, instead of having only one thin-film resonator. In this case, for example, at least one further piezoelectric layer is arranged on the upper electrode. A further electrode is provided on this piezoelectric layer.

The electrically conductive mirror layer, which acts as a coupling layer, forms coupling capacitances with lower electrodes of the thin-film resonators, thus resulting in deliberate capacitive coupling between the resonators, which, according to the invention, is used in order to achieve additional notches in the stopband regions of the filter transfer function. The capacitive coupling of the resonators may, for example, be influenced by partial structuring of the coupling layer in order, in particular, to shift the frequency of the notches.

DESCRIPTION OF THE DRAWINGS

The inventive component and method for its manufacture are explained in more detail in the following text with reference to exemplary embodiments and the associated figures, which are schematic and therefore not to scale.

DETAILED DESCRIPTION OF THE PREFERRED EMBODIMENTS

Figure 2A:
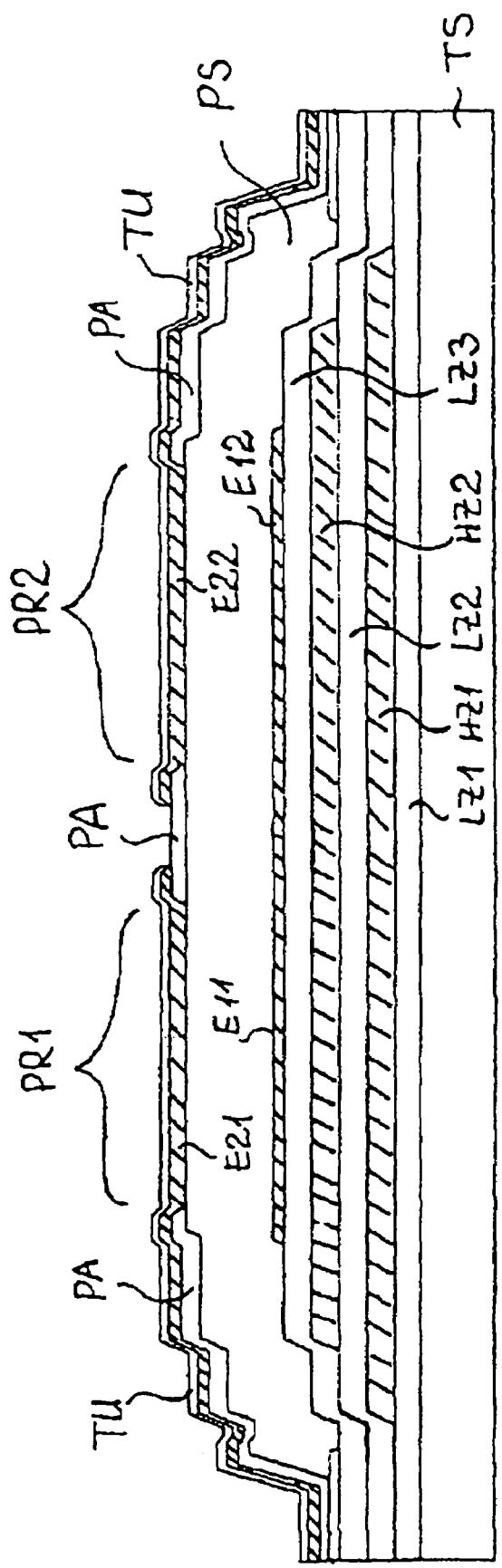
FIG. 2a is a schematic cross section through the layer structure of a component according to an embodiment of the invention with capacitive coupling between two resonators whose lower electrodes are electrically connected to one another.

FIGS. 2a, b illustrate general features of the invention in an embodiment on the basis of a schematic illustration of the layer structure of a component according to the invention. Identical elements and elements having the same effect are provided with the same reference symbols in all the figures.

Figure 1:
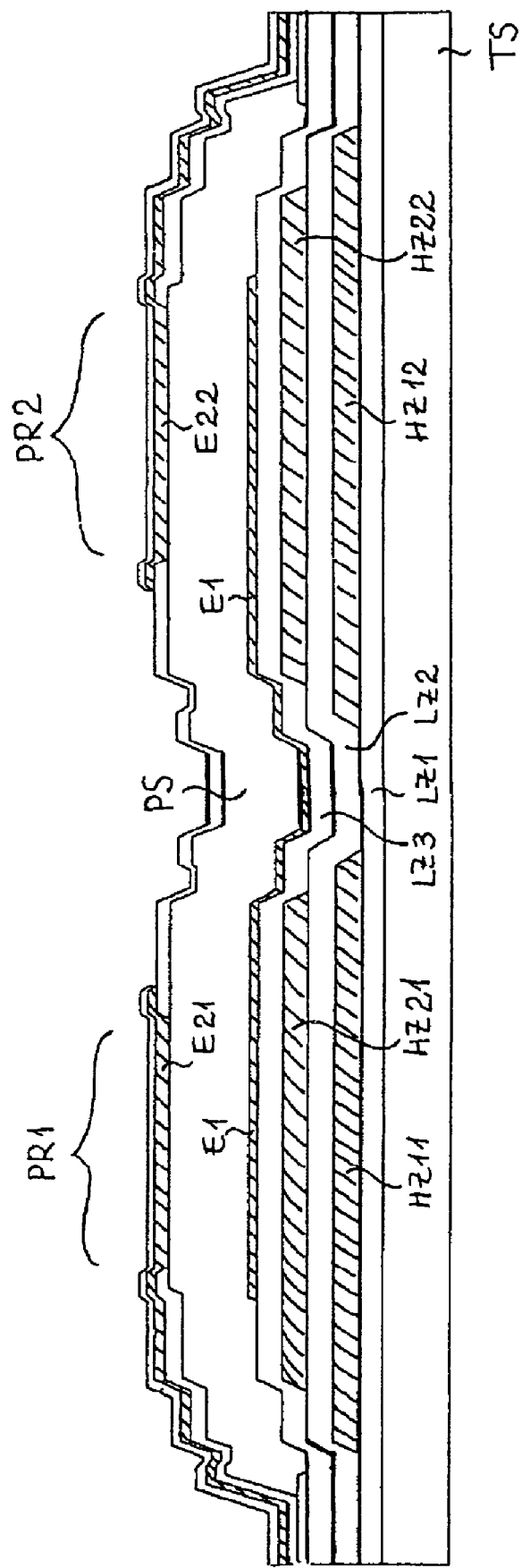
FIG. 1 is a schematic cross section through a known component which operates with bulk acoustic waves and has two thin-film resonators.

FIG. 1 shows a schematic cross section through a known component which operates with bulk acoustic waves and has two resonators PR1 and PR2, which are arranged on separate acoustic mirrors.

FIG. 2a shows a schematic cross section through the layer structure of a component according to the invention with capacitive coupling between two resonators (preferably parallel resonators) PR1 and PR2, whose lower electrodes E11 and E12, respectively, are electrically connected to one another. The upper electrodes of the first and of the second resonator are annotated E21 and E22, respectively. Away from an active resonator area, which is defined by the overlapping area of the upper and lower electrodes, a structured passivation layer PA can be provided on the piezoelectric layer PS. A tuning layer TU is provided on the upper electrodes in order to tune the frequency of the resonator and may be composed, for example, of silicon oxide.

The resonators PR1 and PR2 are arranged on a common acoustic mirror with an alternating sequence of mirror layers LZ1, LZ2, LZ3 and HZ1, HZ2 with low and high acoustic impedance, respectively, and with at least one of the mirror layers HZ1, HZ2 being a continuous conductive layer and acting as a coupling layer. The coupling layer forms a coupling capacitance both with the lower electrode E11 and with the lower electrode E12 and thus (in parallel with the electrical connection of the electrodes which, in the radio-frequency band, can be regarded as a circuit element with a finite impedance) forms a series circuit of these coupling capacitances between the lower electrodes E11 and E12.

The mirror layers with a high acoustic impedance may, for example, be formed from tungsten or aluminum nitride. The mirror layers with a low acoustic impedance may, for example, be formed from silicon oxide. The thickness of the mirror layers is preferably one quarter of the wavelength in the given material.

The piezoelectric layer in the resonator according to the invention is preferably formed from aluminum nitride. It is also possible for it to be formed from ZnO, $LiNbO_3$, $LiTaO_3$, polycrystalline quartz, or any desired layer sequence of these materials.

The electrodes may, for example, be formed from aluminum, tungsten or aluminum nitride.

The carrier substrate TS may have a multilayer structure composed of alternately arranged dielectric layers and structured metal layers. Integrated circuit elements can be provided in the metal layers by way of structured conductor tracks and surfaces.

The electrodes, the piezoelectric layer and the mirror layers may each comprise two or more layers.

Figure 2B:
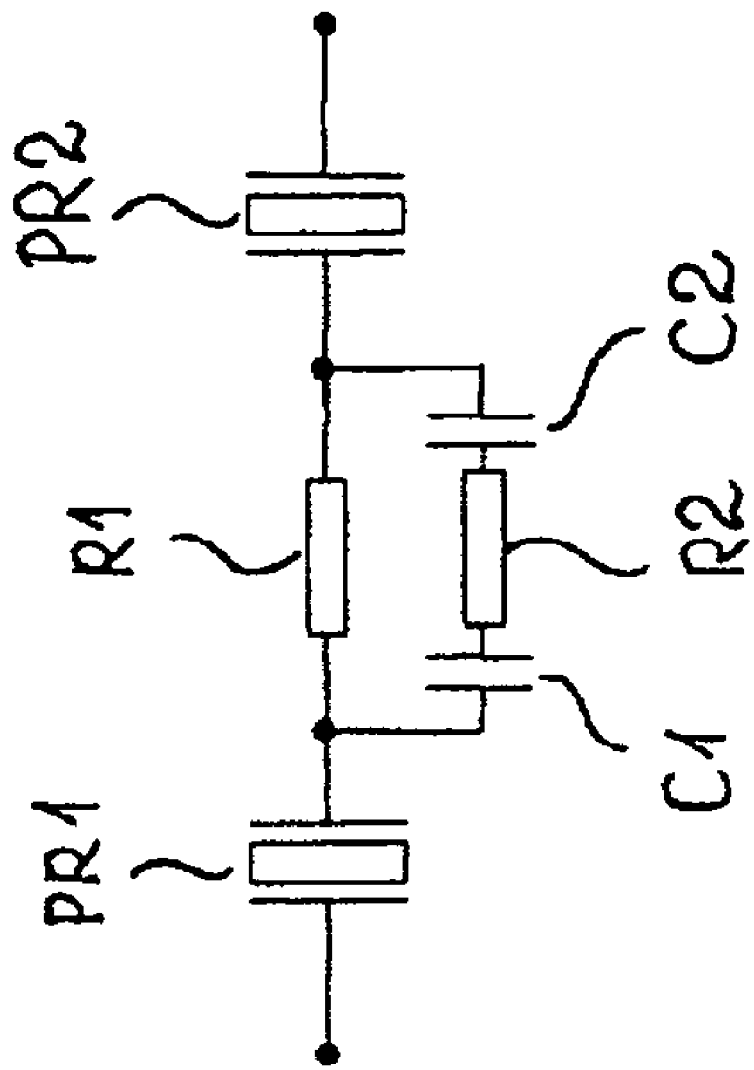
FIG. 2b is a schematic equivalent circuit diagram of an arrangement of two thin-film resonators that are arranged as shown in FIG. 2a and are capacitively coupled to one another.

FIG. 2b shows an equivalent circuit of two resonators which are electrically and capacitively coupled to one another and are arranged as shown in FIG. 2a. The electrical connection between the resonators PR1 and PR2 by way of a line section is illustrated schematically here as a first impedance R1. A first coupling capacitance C1 is formed essentially by the electrode E11 of the first resonator PR1 and by the surface, arranged underneath it, of the coupling layer HZ2. A second coupling capacitance C2 is formed essentially by the electrode E12 of the second resonator PR2 and by the surface, arranged underneath it, of the coupling layer HZ2. The electrical connection between the surfaces of the coupling layer HZ2 which are arranged under the first and second resonators is illustrated schematically as a second impedance R2.

Figure 3:
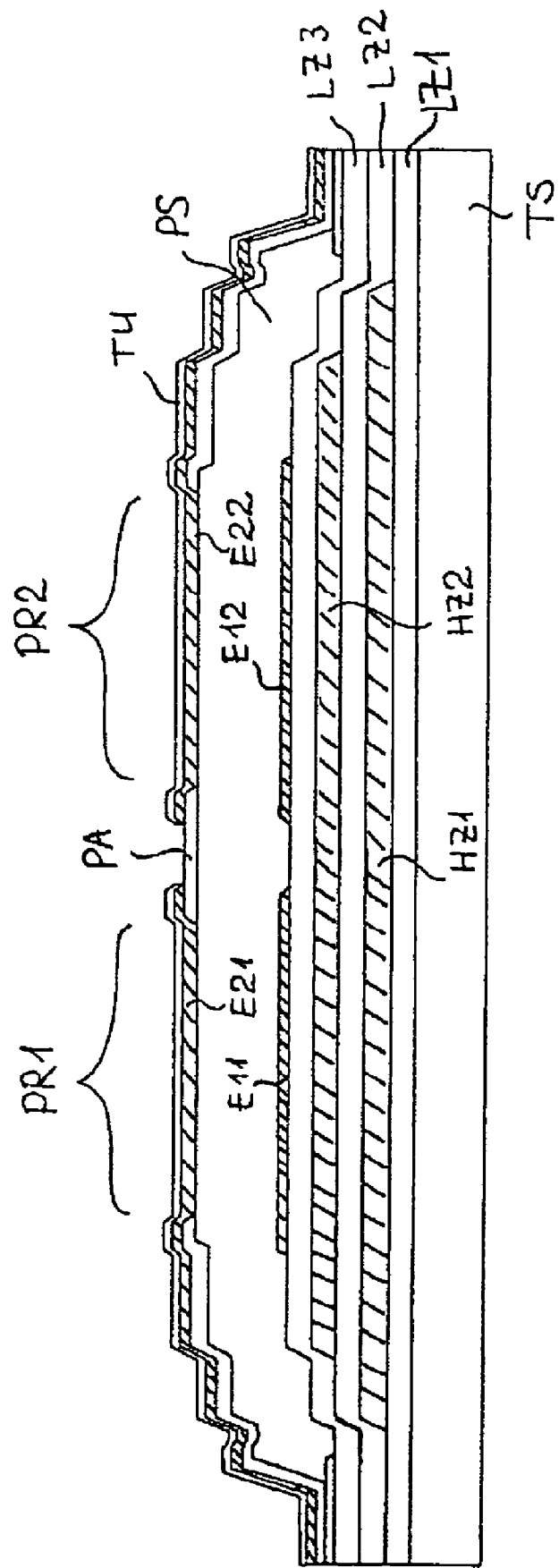
FIG. 3 is a schematic cross section through the layer structure of a component according to the invention with capacitive coupling between the two resonators whose lower electrodes are not electrically connected to one another.

FIG. 3 shows a schematic cross section through the layer structure of a component according to an embodiment of the invention with capacitive coupling between two resonators (preferably parallel resonators) PR1 and PR2, whose lower electrodes E11 and E12, respectively, are not electrically connected to one another.

Figure 4:
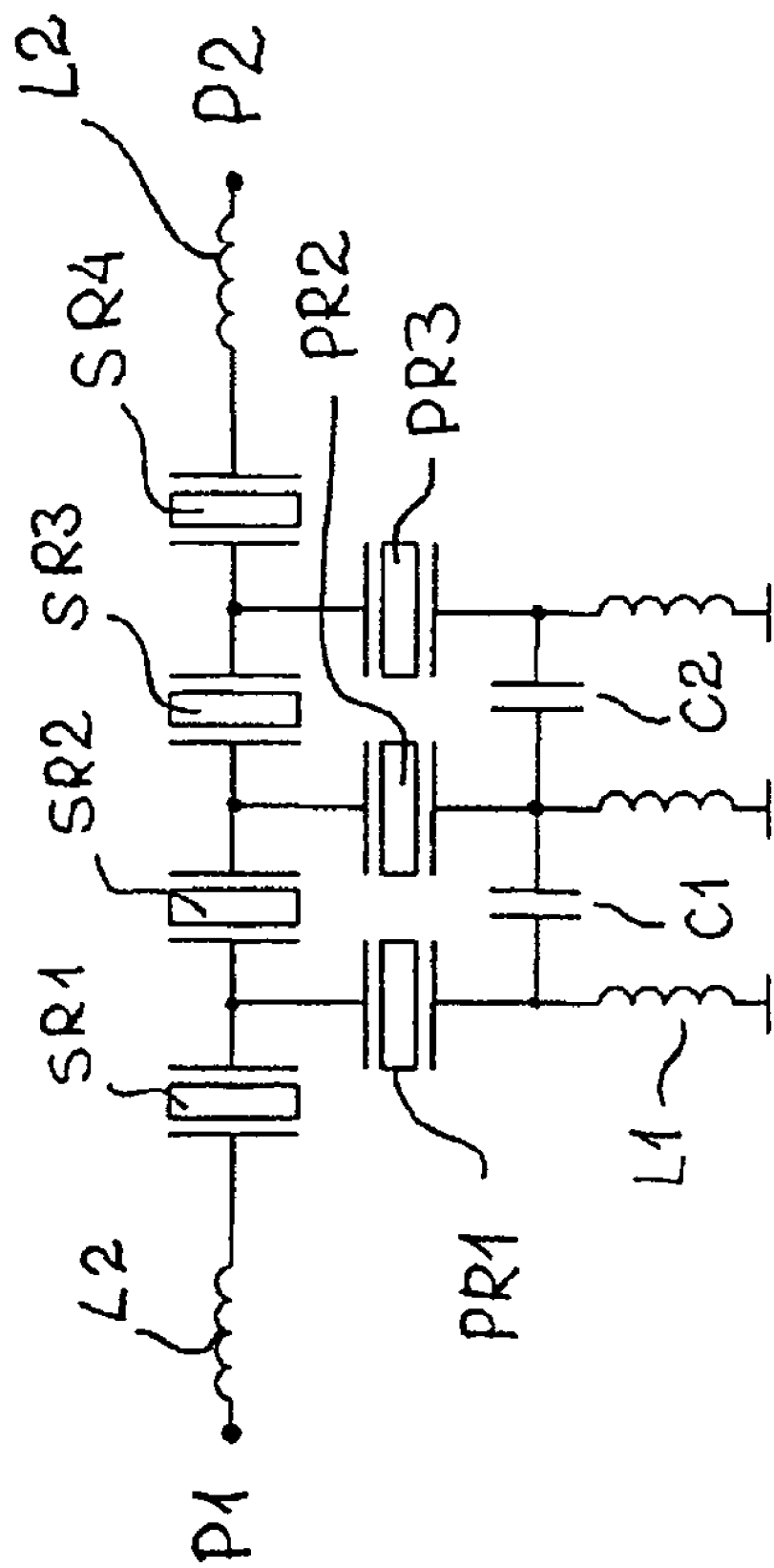
FIG. 4 is a schematic equivalent circuit diagram of a ladder type arrangement of thin-film resonators, with the parallel resonators being arranged as shown in FIG. 3 and being capacitively coupled to one another.

FIG. 4 shows an equivalent circuit of a ladder type arrangement of series and parallel resonators (SR1 to SR4 and PR1 to PR3 respectively), with at least two of the parallel resonators being arranged as shown in FIG. 3 and being capacitively coupled to one another via the coupling layer HZ1 and/or HZ2. In a preferred variant, all the parallel resonators are capacitively coupled to one another via at least one electrically conductive mirror layer.

The parallel resonators are each connected to ground via an inductance L1, which may be chosen specifically. The series resonators SR1 to SR4 which are arranged in the series branch are connected via inductances L2 to an input port P1 and to an output port P2.

The inductance L1, L2 may, for example, comprise bump connections and/or plated-through holes, or may be formed exclusively by them. It is also possible for the inductance L1, L2 to be in the form of a conductor track which is buried in the carrier substrate. Furthermore, a discrete component may also be provided as the inductance L1, L2.

The coupling capacitances C1, C2 may form additional resonant circuits (i.e., resonant circuits which do not exist without the coupling capacitances) together with further elements, for example, inductances L1, L2, and may thus produce additional resonances which can be used to increase the attenuation in the stopband ranges, in particular for the second or third harmonics of the resonator operating frequency.

In FIGS. 5 to 8, all the high-impedance layers are preferably in the form of electrically conductive layers.

Figure 5:
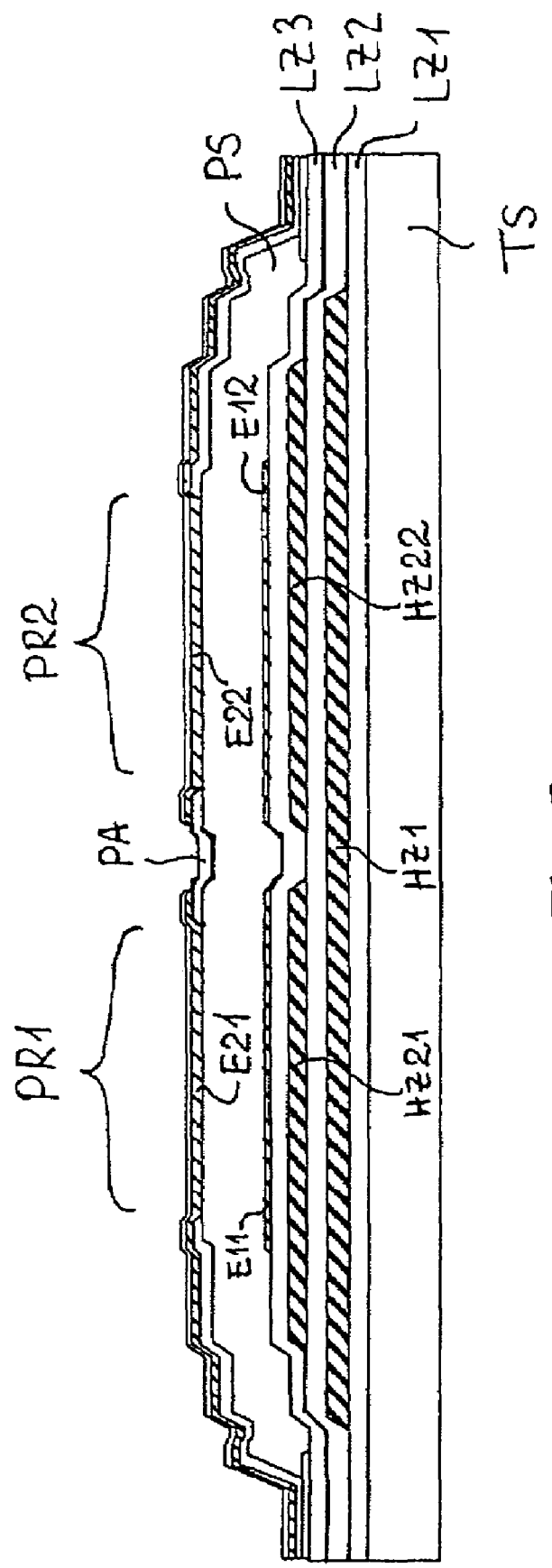
FIG. 5 is a schematic cross section through the layer structure of a component according to an embodiment of the invention with capacitive coupling between two resonators via structured conductive mirror layers.

FIG. 5 shows a further advantageous exemplary embodiment of the invention with a structured upper high-impedance layer, which has a structure HZ21 arranged under the first resonator PR1, and a structure HZ22 arranged under the second resonator PR2. These structures are capacitively connected on the one hand to the cohesive lower high-impedance layer HZ1 (which in this case acts as a coupling layer) and on the other hand are in each case connected to one of the lower electrodes E11 and E12. This results in a series circuit with a total of four coupling capacitances being formed between the lower electrodes E11 and E12.

Figure 6:
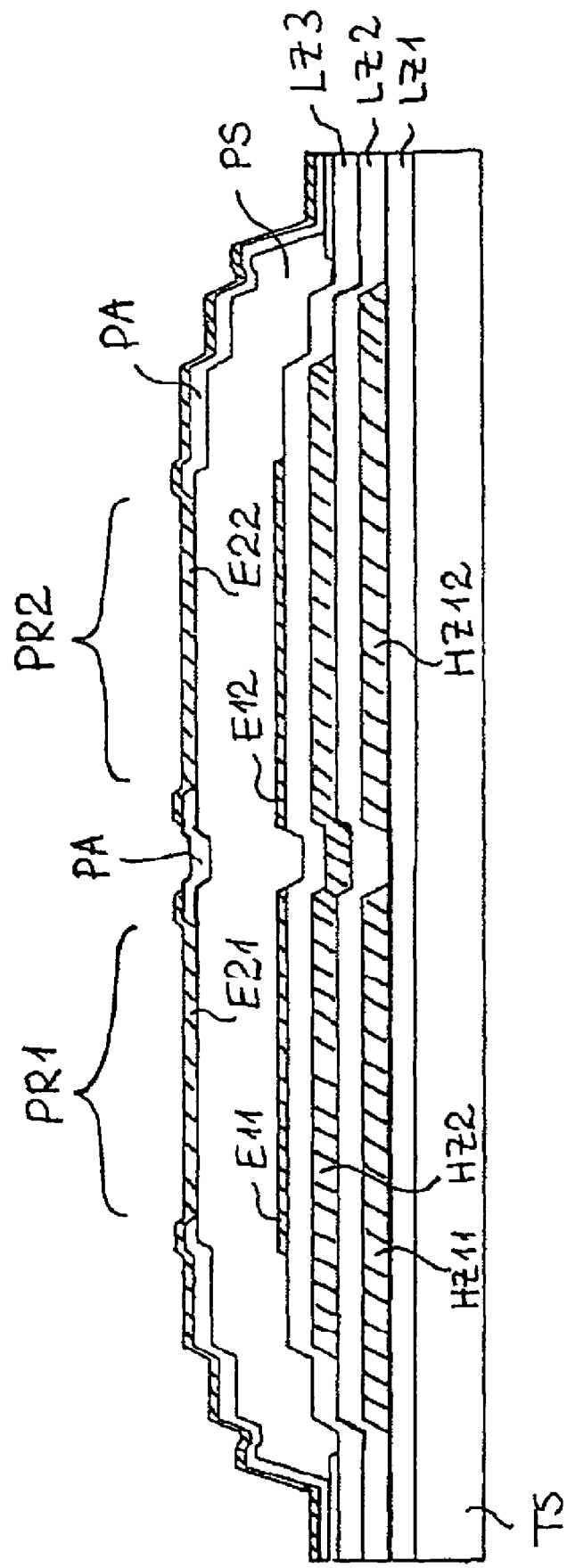
FIG. 6 is a schematic cross section through the layer structure of a component according to an additional embodiment of the invention with capacitive coupling between two resonators via structured conductive mirror layers.

FIG. 6 shows a variant of the invention with a structured lower high impedance layer which has a structure HZ11 arranged under the first resonator PR1, and a structure HZ12 arranged under the second resonator PR2. The upper high-impedance layer HZ2 is in this case in the form of a cohesive layer.

It is possible to achieve capacitive coupling between the lower electrodes of the resonators when all of the conductive mirror layers are structured and have structures which are arranged under respective resonators and are not electrically connected to one another. In this case, the capacitive coupling can be provided when, for example, two structures which are arranged underneath resonators that are located alongside one another in different mirror layers partially overlap one another in the vertical direction. Another possibility is for a structure which is arranged under the first resonator to partially overlap the lower electrode of the second resonator in the vertical direction. Appropriate structuring of the conductive mirror layers and changing the overlapping area of conductive structures which are arranged one above the other make it possible in particular to match the value of the coupling capacitance formed between them, and thus the frequency of the notches of the filter transfer function.

Figure 7:
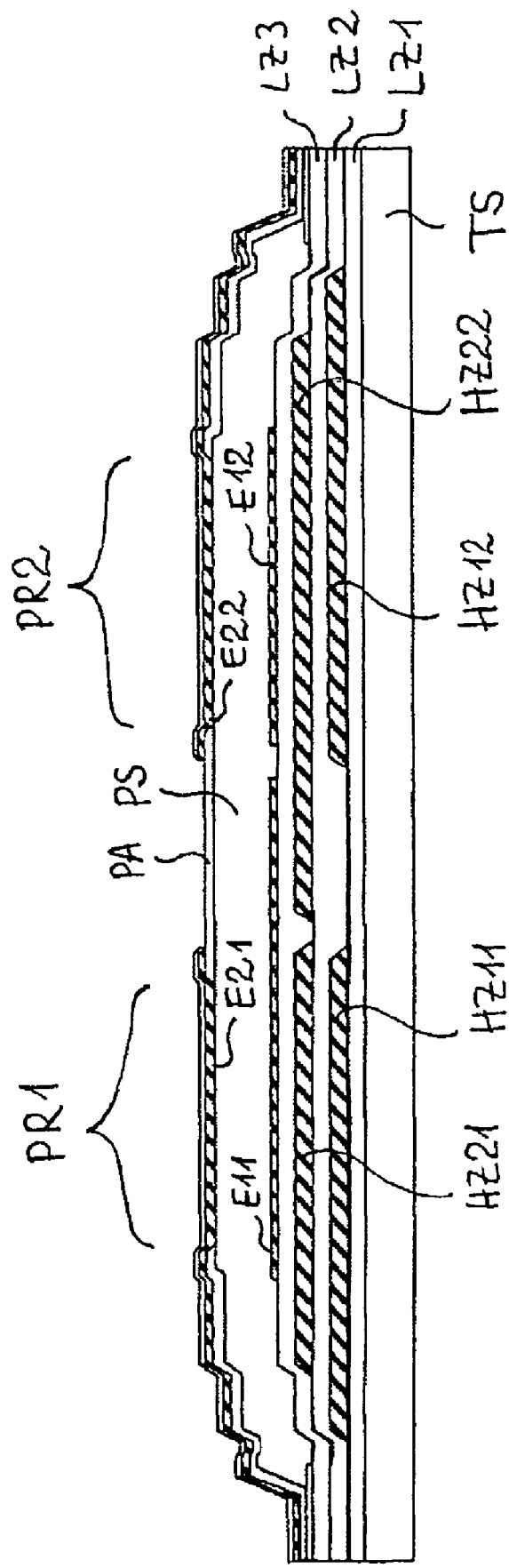
FIG. 7 is a schematic cross section through the layer structure of a component according to an additional embodiment of the invention with capacitive coupling between two resonators via structured conductive mirror layers.

FIG. 7 shows a variant of the invention in which more than only one high-impedance layer (or all of the high-impedance layers) are structured. The structure HZ22, which is arranged under the second resonator PR2, of the upper high-impedance layer is partially arranged under the lower electrode E11 of the first resonator PR1, and thus ensures capacitive coupling between the lower electrodes E11 and E12.

Figure 8:
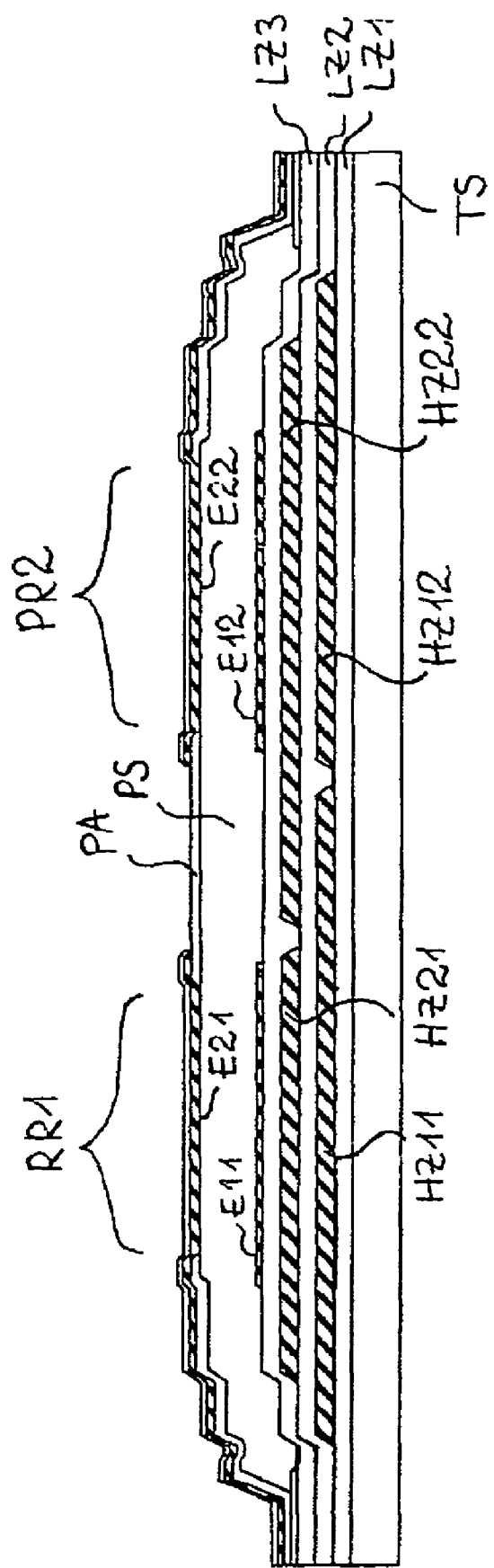
FIG. 8 is a schematic cross section through the layer structure of a component according to an additional embodiment of the invention with capacitive coupling between two resonators via structured conductive mirror layers.

FIG. 8 shows a further variant of the invention, in which all of the high-impedance layers are structured. The structure HZ22, which is arranged under the second resonator PR2, of the upper high-impedance layer partially overlaps the structure HZ11, which is arranged under the first resonator PR1, of the lower high-impedance layer. In this case too, the structure HZ11 is arranged under the structure HZ21 or the lower electrode E11 of the first resonator, and is thus capacitively coupled to them. The lower electrodes E11 and E12 are coupled by the series connection of the coupling capacitances which are formed between the structures E12, HZ22, HZ11, HZ21 and E11.

For the sake of clarity, the invention has been described on the basis of only a small number of embodiments, but is not restricted to these embodiments. Further variation options relate in particular to the possible combination of the arrangements described above. The invention is not restricted to a specific frequency band or to a specific field of application. No limitation of the scope of the invention is intended by this specific language, and the invention should be construed to encompass all embodiments that would normally occur to one of ordinary skill in the art. It should be noted that many alternative or additional functional relationships, physical connections or logical connections may be present in a practical device. Moreover, no item or component is essential to the practice of the invention unless the element is specifically described as "essential" or "critical". Numerous modifications and adaptations will be readily apparent to those skilled in this art without departing from the spirit and scope of the present invention.

What is claimed is:

1. A component operating with bulk acoustic waves, comprising:

an acoustic mirror comprising an electrically conductive mirror layer that acts as a coupling layer;

a signal path along which an electrical signal is guided; and a number N of resonators that are electrically connected to one another and each having a lower and an upper electrode, with n resonators, where $2 \leq n \leq N-1$, being arranged jointly and alongside one another on the acoustic mirror, the n resonators being coupled to one another via coupling capacitances that are formed: a)

by lower electrodes of the n resonators, and b) by at least one of the coupling layer and further capacitively coupled electrically conductive mirror layers, with the n resonators being arranged and electrically connected to one another such that the coupling capacitance does not bridge any of the resonators in the signal path.

2. The component as claimed in claim 1, wherein two resonators that are arranged in the signal path and are capacitively coupled to one another via their lower electrode are in each case either: a) not electrically connected to one another, or b) are electrically connected to one another only via the lower electrode.

3. The component as claimed in claim 1, further comprising further electrically conductive mirror layers.

4. The component as claimed in claim 3, wherein at least one of the further electrically conductive mirror layers acts as a further coupling layer.

5. The component as claimed in claim 3, wherein two or more of the electrically conductive mirror layers are structured, with at least two of the structured electrically conductive mirror layers being capacitively coupled to one another.

6. The component as claimed in claim 5, wherein the resonators that are arranged on the acoustic mirror are capacitively coupled to one another via the capacitively coupled structured mirror layers.

7. The component as claimed in claim 3, wherein at least some of the n resonators are in the form of series resonators.

8. The component as claimed in claim 1, wherein the n resonators are in the form of parallel resonators.

9. The component as claimed in claim 8, further comprising an inductance via which the parallel resonators are each connected to ground.

10. The component as claimed in claim 1, further comprising a carrier substrate on which the acoustic mirror is arranged.

11. The component as claimed in claim 10, wherein the carrier substrate comprises two or more dielectric layers, with a metallization level being provided between each two successive dielectric layers.

* * * * *